United States Patent
Du et al.

(10) Patent No.: US 11,074,174 B2
(45) Date of Patent: Jul. 27, 2021

(54) METHOD FOR MANAGING FLASH MEMORY MODULE AND ASSOCIATED FLASH MEMORY CONTROLLER AND ELECTRONIC DEVICE BASED ON TIMING OF DUMMY READ OPERATIONS

(71) Applicant: Silicon Motion, Inc., Hsinchu County (TW)

(72) Inventors: Jian-Dong Du, Taoyuan (TW); Chia-Jung Hsiao, New Taipei (TW); Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/683,191

(22) Filed: Nov. 13, 2019

(65) Prior Publication Data

US 2020/0242024 A1 Jul. 30, 2020

(30) Foreign Application Priority Data

Jan. 24, 2019 (TW) .................................. 108102728

(51) Int. Cl.
| | |
|---|---|
| *G11C 11/4093* | (2006.01) |
| *G11C 11/4074* | (2006.01) |
| *G06F 12/02* | (2006.01) |
| *G06F 12/0882* | (2016.01) |
| *G11C 11/4099* | (2006.01) |
| *G06F 13/16* | (2006.01) |

(52) U.S. Cl.
CPC ...... *G06F 12/0246* (2013.01); *G06F 12/0882* (2013.01); *G06F 13/1689* (2013.01); *G11C 11/4074* (2013.01); *G11C 11/4093* (2013.01); *G11C 11/4099* (2013.01)

(58) Field of Classification Search
CPC ............. G06F 12/0246; G06F 12/0882; G06F 9/4401; G11C 11/4093; G11C 11/4099; G11C 11/4074; G11C 16/32; G11C 16/10
See application file for complete search history.

(56) References Cited

U.S. PATENT DOCUMENTS

| | | | |
|---|---|---|---|
| 9,910,676 B1* | 3/2018 | Sivaraman Nair | ... G06F 9/4401 |
| 2013/0036261 A1* | 2/2013 | Kim | ..................... G06F 11/1048 711/103 |
| 2015/0293700 A1* | 10/2015 | Sasaki | ..................... G06F 16/00 711/113 |
| 2019/0074283 A1* | 3/2019 | Amaki | ................... G11C 16/16 |

FOREIGN PATENT DOCUMENTS

| | | |
|---|---|---|
| CN | 108932175 A | 12/2018 |
| TW | I623878 B | 5/2018 |
| TW | 201828294 A | 8/2018 |

* cited by examiner

*Primary Examiner* — Sultana Begum
(74) *Attorney, Agent, or Firm* — Winston Hsu

(57) ABSTRACT

The present invention provides a flash memory controller, wherein the flash memory controller is arranged to access a flash memory module, and the flash memory controller includes a ROM, a microprocessor and a timer. The ROM stores a program code, the microprocessor is configured to execute the program code to control the access of the flash memory module, and the timer is used to generate time information. In the operations of the flash memory controller, the microprocessor refers to the time information to perform dummy read operations upon at least a portion of the blocks, wherein the dummy read operations are not triggered by read commands from a host device.

12 Claims, 8 Drawing Sheets

| | |
|---|---|
| B_1 | Time information |
| B_2 | Time information |
| B_3 | Time information |
| B_4 | Time information |
| B_5 | Time information |
| ⋮ | ⋮ |

| | |
|---|---|
| B_123 | 14:01 |
| B_75 | 14:02 |
| B_67 | 14:03 |
| B_123 | 14:04 |
| B_4 | 14:05 |
| B_5 | 14:30 |
| B_67 | 14:31 |
| B_123 | 14:40 |
| ⋮ | ⋮ |

FIG. 6

| 600 | | | | | | | | |
|---|---|---|---|---|---|---|---|---|
| 14:02 | 14:05 | 14:30 | 14:31 | 14:40 | ... | | | |
| B_75 | B_4 | B_5 | B_67 | B_123 | ... | | | |

↑

| 600 | | | | | | | | |
|---|---|---|---|---|---|---|---|---|
| ~~14:01~~ | 14:02 | ~~14:03~~ | ~~14:04~~ | 14:05 | 14:30 | 14:31 | 14:40 | ... |
| ~~B_123~~ | B_75 | ~~B_67~~ | ~~B_123~~ | B_4 | B_5 | B_67 | B_123 | ... |

FIG. 7

METHOD FOR MANAGING FLASH MEMORY MODULE AND ASSOCIATED FLASH MEMORY CONTROLLER AND ELECTRONIC DEVICE BASED ON TIMING OF DUMMY READ OPERATIONS

BACKGROUND OF THE INVENTION

1. Field of the Invention

The present invention relates to a flash memory controller.

2. Description of the Prior Art

With the developments of flash memory techniques, the arrangement of memory units in a flash memory chip has changed from parallel arrangements to stacked multi-layer fashions, which allows a chip to comprise more memory units and therefore increases the overall capacity of the chip. However, the aforementioned 3D flash memory design suffers from data reading quality issues, i.e., the data quality thereof could drop drastically if the data in a block has not be read for long, resulting in difficulties in decoding the data, or making the data unable be read correctly. Hence, there is a need for a novel management method to solve the above data retention issue.

SUMMARY OF THE INVENTION

Therefore, an objective of the present invention is to provide a method for managing flash memories, which may effectively avoid the aforementioned the deterioration of data in blocks due to not being read for long, thereby solving the difficulties encountered in related arts.

An embodiment of the present invention discloses a flash memory controller. The flash memory controller is arranged to access a flash memory module, the flash memory module comprises multiple flash memory chips, each of the flash memory chips comprises multiple blocks, each of the blocks comprises multiple pages, and the flash memory controller comprises a read only memory (ROM), a microprocessor and a timer. The ROM is arranged to store a program code. The microprocessor is arranged to execute the program code to control the access of the flash memory module. The timer is arranged to generate time information. The microprocessor refers to the time information generated by the timer to perform a dummy read operation upon at least one portion of blocks of said multiple blocks, wherein the dummy read operation is not triggered by a read command from a host device.

Another embodiment of the present invention discloses a method for managing a flash memory module. The flash memory module comprises multiple flash memory chips, each of the flash memory chips comprises multiple blocks, each of the blocks comprises multiple pages, and the method comprises: using a timer to generate a time information; and performing a dummy read operation upon at least one portion of blocks among said multiple blocks according to the time information generated by the timer, wherein the dummy read operation is not triggered by a read command of a host device.

Yet another embodiment of the present invention discloses an electronic device which comprises a flash memory module and a flash memory controller. The flash memory module comprises multiple flash memory chips, each of the flash memory chips comprises multiple blocks, and each of the blocks comprises multiple pages. The flash memory controller is arranged to access the flash memory module. The flash memory controller performs a dummy read operation upon at least one portion of blocks among said multiple blocks according to time information generated by a timer, wherein the dummy read operation is not triggered by a read command of a host device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a diagram illustrating a block reading time recording table according to an embodiment of the present invention.

FIG. 7 is a diagram illustrating updating the block reading time recording table according to an embodiment of the present invention.

DETAILED DESCRIPTION

Figure 1:
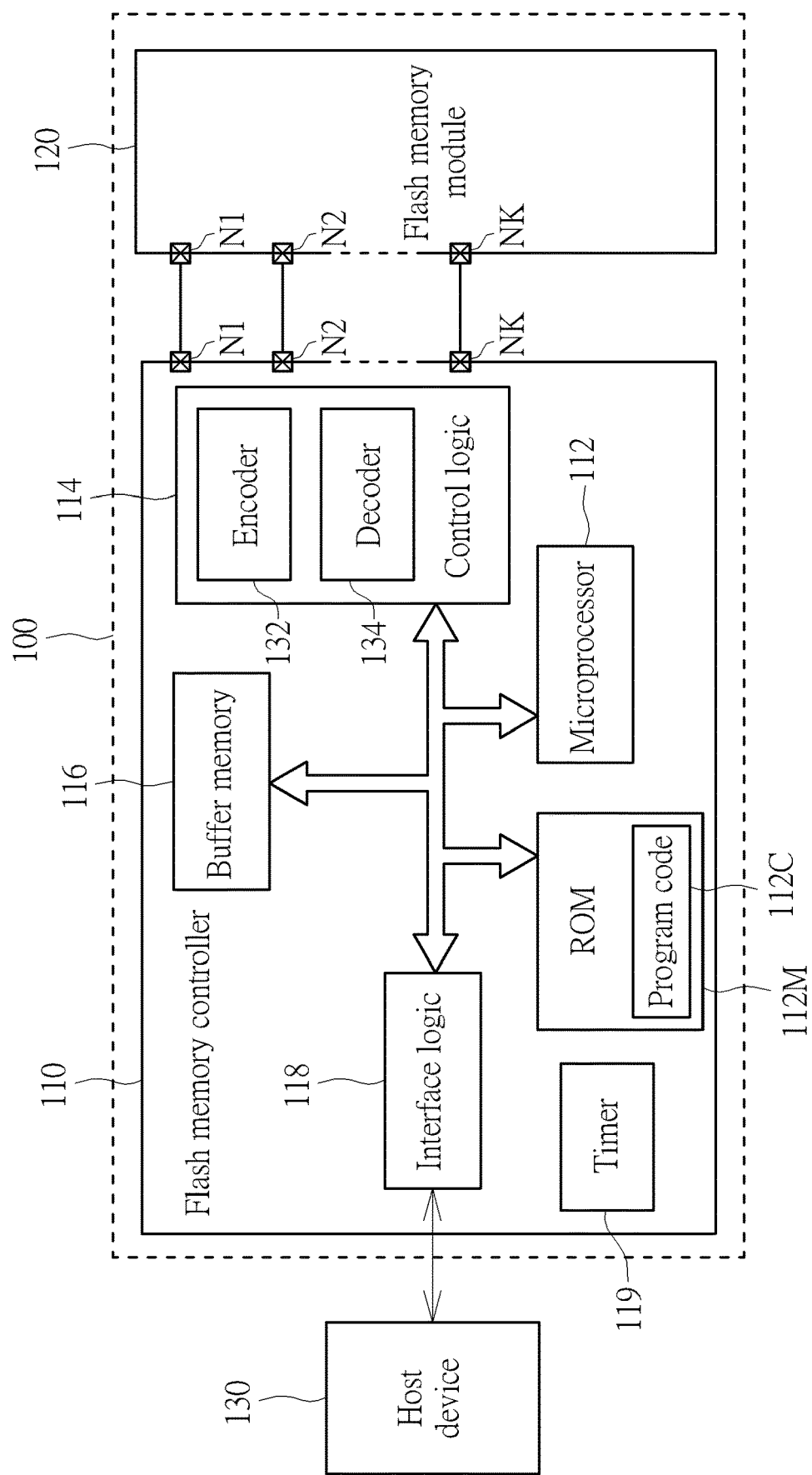
FIG. 1 is a diagram illustrating a memory device according to a first embodiment of the present invention.

FIG. 1 is a diagram illustrating a memory device 100 according to a first embodiment of the present invention. The memory device 100 comprises a flash memory module 120 and a flash memory controller 110, and the flash memory controller 110 is arranged to access the flash memory module 120. In this embodiment, the flash memory controller 110 comprises a microprocessor 112, a read only memory (ROM) 112M, a control logic 114, a buffer memory 116, an interface logic 118 and a time-management circuit 119. The ROM 112M is arranged to store a program code 112C, and the microprocessor 112 is arranged to execute the program code 112C to control the access of the flash memory module 120. The control logic 114 comprises an encoder 132 and a decoder 134, wherein the encoder 132 is arranged to encode the data written into the flash memory module 120 in order to generate a corresponding checking code (which can be also called as error correction code, ECC), and the decoder 134 is arranged to decode the data read from the flash memory module 120.

In addition, both of the flash memory controller 110 and the flash memory module 120 comprise multiple pins N1-NK each connected to the counterpart thereof for the transmissions of data and commands therebetween. Since the functions of the pins N1-NK may be referred to the related specifications of flash memories, the detailed descriptions are omitted here for brevity.

Typically, the flash memory module 120 comprises multiple flash memory chips, and each flash memory chip comprises a plurality of blocks. The flash memory controller 110 uses "block" as the unit to erase data from the flash memory module 120. A block may record a specific number of pages, and the flash memory controller 110 uses "page" as the unit to write data into the flash memory module 120. In this embodiment, the flash memory module 120 may be a 3D NAND flash memory module.

In practice, the flash memory controller 110 that uses the microprocessor 112 to execute the program code 112C may utilize the inner elements thereof to perform various control operations, such as: utilizing the control logic 114 to control the access of the flash memory module 120 (more particularly the access of at least one block or at least one page), utilizing the buffer memory 116 to perform the needed buffering process, and utilizing the interface logic 118 to communicate with a host device 130. The buffer memory 116 may be implemented with a random access memory (RAM). For example, the buffer memory 116 may be a static random access memory (SRAM), but the present invention is not limited thereto.

In an embodiment, the memory device 100 may be a portable memory device (e.g. a memory card conforming to the SD/MMC, CF, MS and/or XD specification), and the host device 130 is an electronic device connectable to a memory device, such as smartphone, laptop computer, desktop computer, etc. In another embodiment, the memory device 100 may be a solid state drive (SSD) or an embedded storage device conforming to the Universal flash storage (UFS) or Embedded Multi Media Card (EMMC) specification, which can be installed in an electronic device, such as a smartphone, laptop computer or desktop computer, wherein the host device 130 may be a processor of the electronic device.

Figure 2:
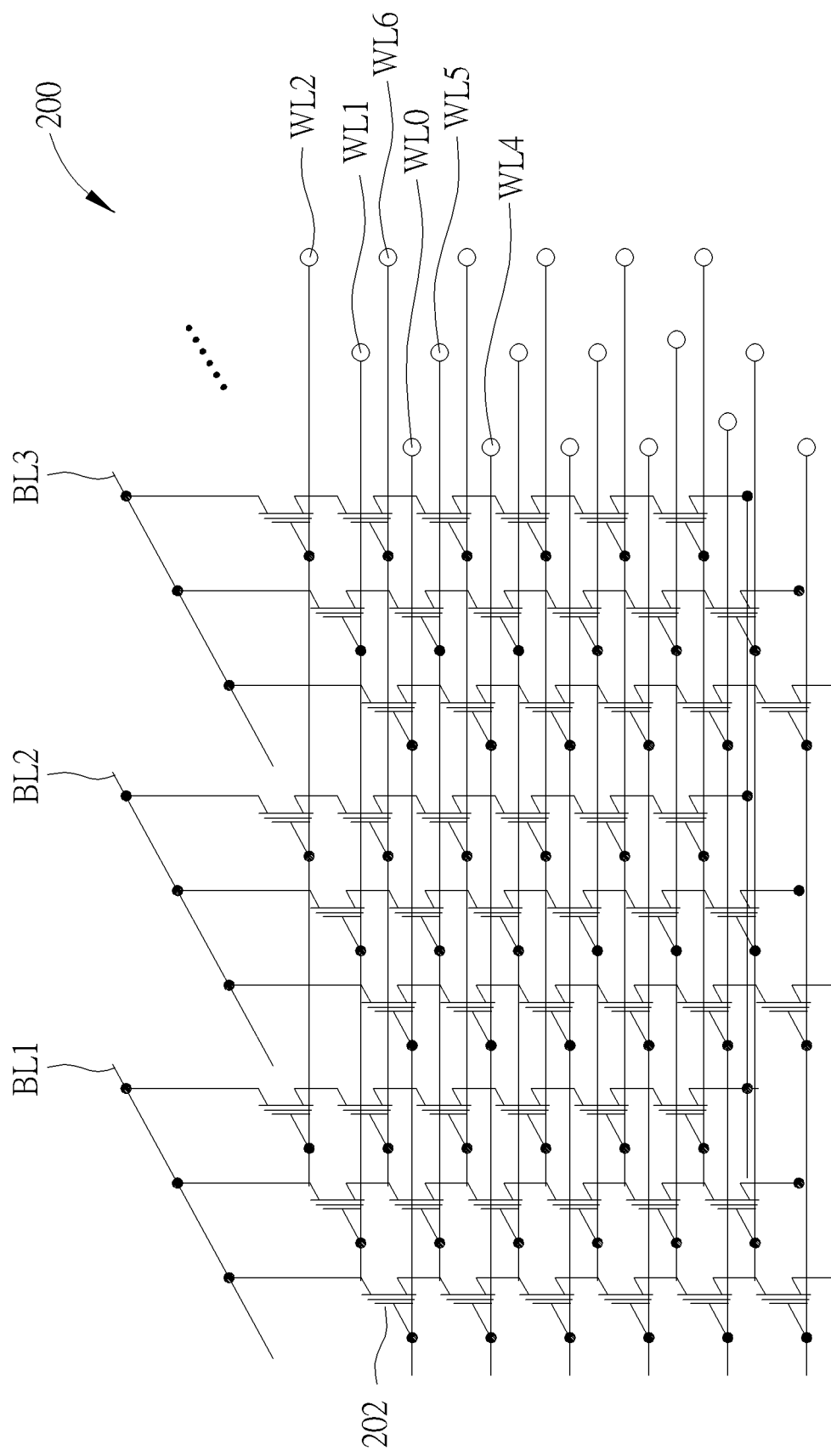
FIG. 2 is a diagram illustrating a block in a flash memory module according to an embodiment of the present invention.

FIG. 2 is a diagram illustrating a block 200 in the flash memory module 120 according to an embodiment of the present invention, wherein the flash memory module 120 is a 3D NAND flash memory. As shown in FIG. 2, the block 200 comprises multiple memory units (e.g. the floating-gate transistor 202 or those charge trapping elements shown in the figure), and constructs a 3D NAND flash memory structure via multiple bit lines (e.g. the bit lines BL1-BL3 shown in the figure) and multiple word lines (e.g. the word lines WL0-WL2, WL4-WL6 shown in the figure). Please refer to FIG. 2, taking the uppermost plane as an example, all floating-gate transistors on the word line WL0 construct at least one page, all floating-gate transistors on the word line WL1 construct at least another page, and all floating-gate transistors on the word line WL2 construct at least yet another page, and so on. Further, based on different writing methods of the flash memory, the definition between the word line WL0 and the page can be different. Specifically, when writing in the single-level cell (SLC) manner, all floating-gate transistors on the word line WL0 are only corresponding to one single logic page; when writing in the multi-level cell (MLC) manner, all floating-gate transistors on the word line WL0 are corresponding to two logic pages; when writing in triple-level cell (TLC) manner, all floating-gate transistors on the word line WL0 are corresponding to three logic pages; and when writing using quad-level cell (QLC) manner, all floating-gate transistors on the word line WL0 are corresponding to four logic pages. Since one skilled in the art should be readily to understand the structure and of a 3D NAND flash memory and the relationship between word lines and pages, the detailed descriptions thereof are omitted here for brevity.

Regarding the operations of the memory device 100, when a block in the flash memory module 120 is written with data, if the block has not been read for long, the data quality of the block may be deteriorated drastically, resulting in difficulties for the decoder 134 in decoding. Hence, in this embodiment, the microprocessor 112 may refer to the time information generated by the timer 119 to perform a dummy read operation upon at least one portion of blocks storing data in the flash memory module 120, in order to avoid the data from deteriorating due to not being read for long. Specifically, the aforementioned dummy read operation means that the microprocessor 112 does not substantially obtain contents of the block from the flash memory module 120, and the dummy read operation is not triggered by the reading commands of the host device 130, that is, the microprocessor 112 does not perform the dummy read operation upon the block due to the request from the host device 130.

In this embodiment, when the microprocessor 112 performs the dummy read operation upon the block, the microprocessor 112 may send a reading request to the flash memory module 120, but the microprocessor 112 will disable a read-enable pin (e.g. the pin N2 shown in FIG. 1) of the flash memory controller 110 in this moment, that is, the flash memory controller 110 cannot obtain the requested data from the flash memory module 120. After receiving the reading request from the flash memory controller 110, the flash memory module 120 may perform reading upon one or more pages of the block and temporarily store the read contents only in the temporarily storage area thereof, and will not send the read data to the flash memory controller 110. As can be seen from the above, performing the dummy read operation upon the block may prevent the data quality of the block from deteriorating due to not being read for long.

In an embodiment, since the objective of performing the dummy read operation is to prevent deterioration of the data quality of the block due to not being read for long, the flash memory controller 110 may request reading one page only in the block to accelerate the dummy read operation.

Figure 3:
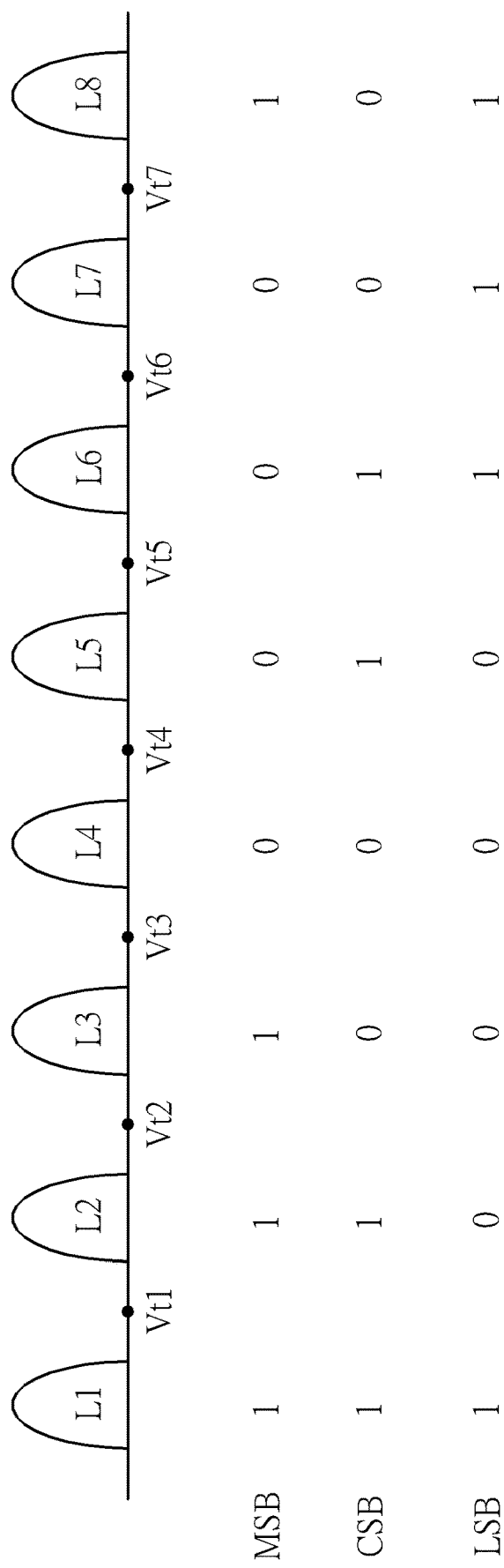
FIG. 3 is a diagram illustrating multiple writing voltage levels and multiple threshold voltages in each memory unit of a TLC block.

In another embodiment, the microprocessor 112 may control/instruct the flash memory module 120 to use the single-level cell (SLC) reading mode to perform the dummy read operation upon the block, despite that the block belongs to an SLC block, multi-level cell (MLC) block, triple-level cell (TLC) block or quad-level cell (QLC) block. An example of implementing the block with a TLC block can be referred to FIG. 3, which is a diagram illustrating multiple writing voltage levels L1-L8 and multiple threshold voltages Vt1-Vt7 in each memory unit of a TLC block. As shown in FIG. 3, each floating gate transistor 202 may be programmed to having the voltage level L1 (i.e. (MSB, CSB, LSB)=(1, 1, 1)), the voltage level L2 (i.e. (MSB, CSB, LSB)=(1, 1, 0)), the voltage level L3 (i.e. (MSB, CSB, LSB)=(1, 0, 0)), the voltage level L4 (i.e. (MSB, CSB, LSB)=(0, 0, 0)), the voltage level L5 (i.e. (MSB, CSB, LSB)=(0, 1, 0)), the voltage level L6 (i.e. (MSB, CSB, LSB)=(0, 1, 1)), the voltage level L7 (i.e. (MSB, CSB, LSB)=(0, 0, 1)) or the voltage level L8 (i.e. (MSB, CSB, LSB)=(1, 0, 1)). When the flash memory controller 110 needs to read the least significant bit (LSB) in the floating gate transistor 202, the flash memory controller 110 may use the threshold voltages Vt1 and Vt5 to read the floating gate transistor 202, and generate "1" or "0" according to the conduction state of the floating gate transistor 202 (e.g. according to whether any current is generated). Similarly, when the flash memory controller 110 needs to read the central significant bit (CSB) in the floating gate transistor 202, the flash memory controller 110 may use the threshold voltages Vt2, Vt4 and Vt6 to read the floating gate transistor 202 and generate "1" or "0" according to the conduction state of the floating gate transistor 202 (e.g. according to whether any current is generated), for the decoder 134 to perform decoding. Similarly, when the flash memory controller 110 needs to read the most significant bit (MSB) in the floating gate transistor 202, the flash memory controller 110 may use the threshold voltages Vt3 and Vt7 to read the floating gate transistor 202, and refer to the conduction state of the floating gate transistor 202 (e.g. according to whether any current is generated) to determine whether the MSB is "1" or "0", for the decoder 134 to perform decoding.

As shown in FIG. 3, in general, reading TLC blocks requires using the multiple threshold voltages Vt1-Vt7 to read the data contents. However, when the microprocessor 112 performs the dummy read operation upon the block (i.e. a TLC block), only a single threshold voltage is used to perform reading upon each memory unit. For example, the flash memory module 120 may only use the threshold voltage Vt4 to read each memory unit, while the rest of the threshold voltages Vt1-Vt3, Vt5-Vt7 are not used during the dummy read operation.

Embodiments regarding the time point of the dummy read operation and how the microprocessor 112 selects blocks that need to be performed with the dummy read operation block are described as follows.

Figure 4:
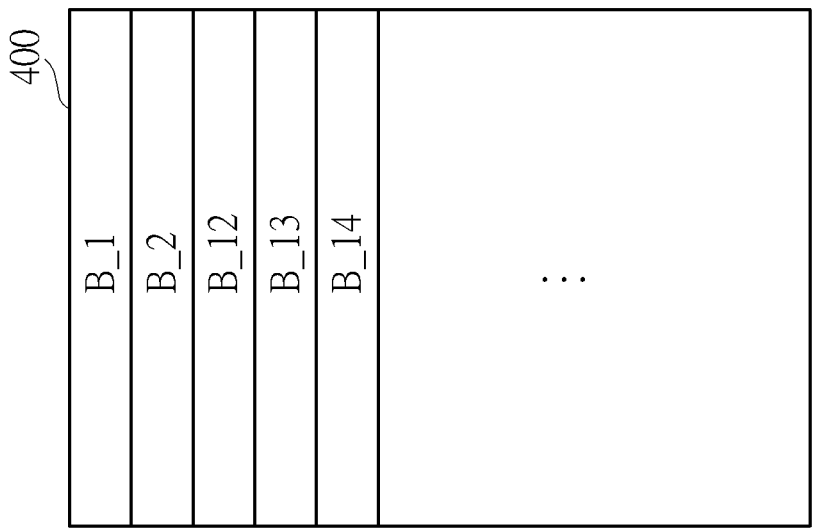
FIG. 4 is a diagram illustrating a block-recording table according to an embodiment of the present invention.
Figure 4:
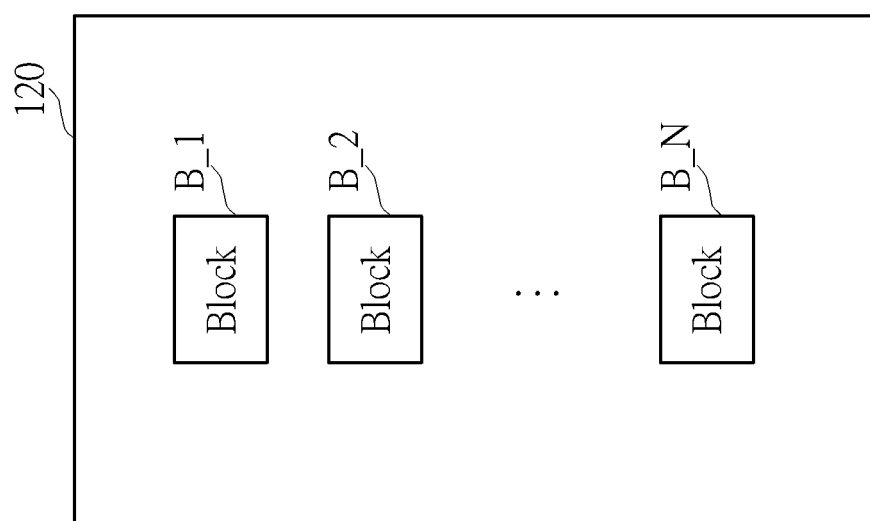

In the first embodiment, the microprocessor 112 may create a block-recording table in order to record which blocks in the flash memory module 120 are storing data. Refer to FIG. 4, which is a diagram illustrating a block-recording table 400 according to an embodiment of the present invention. Assuming the flash memory module 120 comprises multiple blocks B1-BN, the microprocessor 112 may update the contents of the block-recording table 400 during writing data into the flash memory module 120, that is, writing the block serials (e.g. B1, B2, B12, B13, B14 shown in the figure) into the block-recording table 400 when there are blocks written with data in the flash memory module 120, and removing the corresponding block serials from the block-recording table 400 when there are blocks erased or marked as invalid in the flash memory module 120. Hence, the microprocessor 112 may refer to the time information generated by the timer 119 to periodically, such as every 30 minutes, perform the dummy read operation upon the blocks recorded in the block-recording table 400, in order to maintain the data quality of theses blocks storing data.

In this embodiment, the block-recording table 400 may be temporarily stored in the buffer memory 116 or an external dynamic random access memory, and the block-recording table 400 may be written into the flash memory module 120 when the memory device 100 is going to be turned off or when there is a need for releasing memory.

Figure 5:
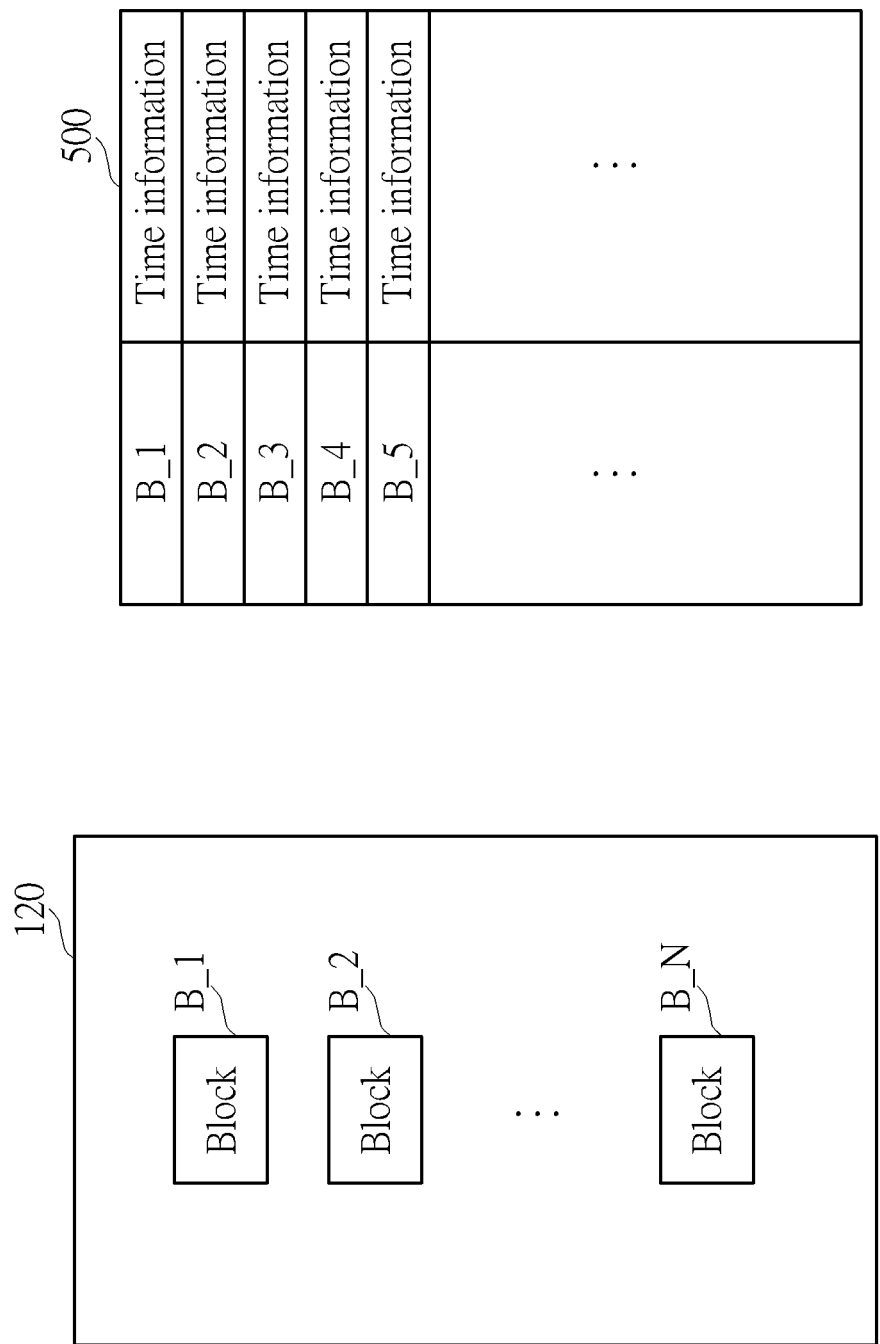
FIG. 5 is a diagram illustrating a block reading time recording table according to an embodiment of the present invention.

In the second embodiment, the microprocessor 112 may create a block reading time recording table to record blocks in the flash memory module 120 that have been read and the corresponding time information thereof. Please refer to refers to FIG. 5, which is a diagram illustrating a block reading time recording table 500 according to an embodiment of the present invention. Assuming the flash memory module 120 comprises multiple blocks B1-BN, when each block in the flash memory module 120 is read, the microprocessor 112 may record the time information of the block (e.g. a time stamp obtained by the host device 130 or the timer 119). In an embodiment, the contents in the block reading time recording table 500 can be constantly updated, which means the block reading time recording table 500 records the latest reading time of each block. Hence, when the microprocessor 112 is not busy, it may select blocks not being read for long to perform the dummy read operation according to the contents of the block reading time recording table 500 to; or otherwise, the microprocessor 112 may periodically (e.g. every 30 minutes) refer to the time information generated by the timer 119 to select blocks not being read for long to perform the dummy read operation according to the contents of the block reading time recording table 500. For example, assuming the block reading time recording table 500 records that the last reading time of the block B_4 and the last reading time of the block B_5 are over 20 minutes ago, the microprocessor 112 may preferentially perform the dummy read operation upon the blocks B_4 and B_5.

In this embodiment, the block reading time recording table 500 may be temporarily stored in the buffer memory 116 or the external dynamic random access memory, and may be written into the flash memory module 120 when the memory device 100 is turned off or when there is a need for releasing memory space for the block reading time recording table 500.

In the third embodiment, the microprocessor 112 may create a block reading time recording table in order to record the block serial of a block and corresponding time information when the block is read. In addition, the block reading time recording table may be further updated/sorted for the following dummy read operations. Please refer to the block reading time recording table 600 shown in FIG. 6. Assuming the microprocessor 112 sequentially reads the blocks B_123, B_75, B_67, B_123, B_4, B_5, B_67, B_123 since 14:01, the microprocessor 112 may sequentially record the read blocks and corresponding time information thereof (e.g., the time stamp shown in the figure) in the block reading time recording table 600 at the same time, wherein the read operation of the aforementioned block is performed according to the reading request of the host device 130. Next, the microprocessor 112 may periodically generate time information according to the timer 119 (e.g. every 5 minutes) to rearrange the contents in the block reading time recording table 600 in order to delete repeated block serials. For example, refers to FIG. 7, since the block B_123 has three reading records, the microprocessor 112 may directly delete the former two reading records. Further, the block B_67 has two reading records, and the microprocessor 112 may directly delete the former one among the two reading records, in order to generate a rearranged block reading time recording table 600.

Next, the microprocessor 112 may refer to the time information generated by the timer 119 to periodically (such as every 10 minutes) to generate a not-to-do list according to the block reading time recording table 600, in order to list the blocks that require shorter reading time and therefore do not need to be performed with the dummy read operation. For example, assuming the current time is 14:40 and the microprocessor 112 sets the blocks that are read within 15 minutes as not needing to be performed with the dummy read operation, and the not-to-do list may comprise the blocks B5, B67, B123 in in this moment. Next, when the microprocessor 112 performs operations, the microprocessor 112 may refer to the block-recording table 400 and the not-to-do list shown in FIG. 4 to perform the dummy read operation upon blocks storing data in the flash memory module 120, rather than the blocks B5, B67, B123 comprised in the not-to-do list.

Finally, after the dummy read operation is finished, the microprocessor 112 directly may remove the blocks that have been performed with the dummy read operation from the block reading time recording table 600. Taking the embodiment in FIG. 7 as an example, the block reading time recording table 600 may directly delete the record of the block B_75 and B4, which means there is no need for recording block serials and corresponding time information of the dummy read operation.

It should be noted that, however, the above three embodiments regarding the time point of the aforementioned dummy read operation and the ways the microprocessor 112 selects blocks that need to be performed with the dummy read operation are merely for illustrative purposes. As long as the microprocessor 112 is able to create associated tables to determine which blocks need to be performed with the dummy read operation, the actual contents of the tables may be modified according to designers' need, and those design modifications shall fall within the scope of the present invention.

Figure 8:
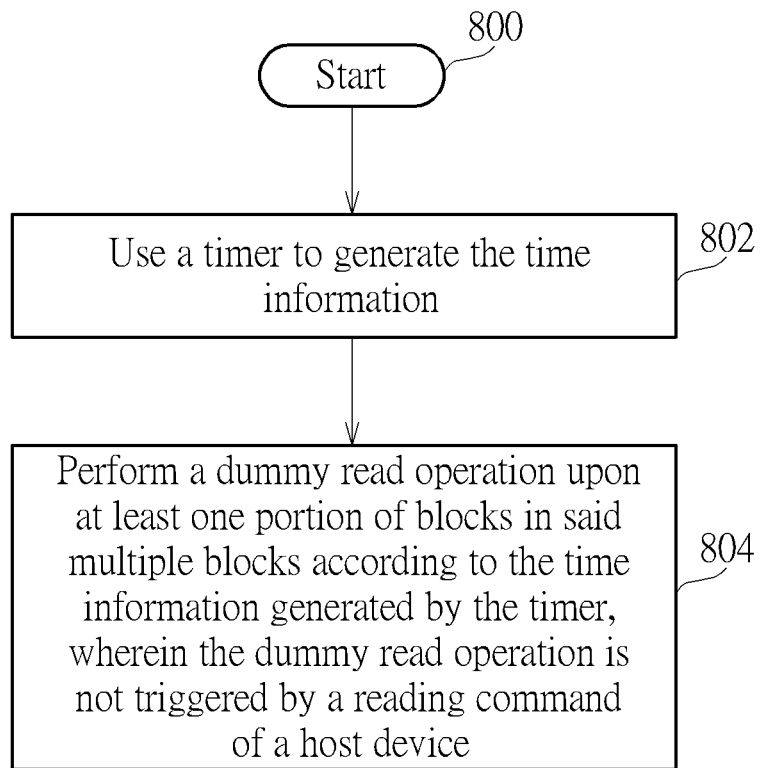
FIG. 8 is a flowchart illustrating a method of managing a flash memory module according to an embodiment of the present invention.

FIG. 8 is a flowchart illustrating a method of managing a flash memory module according to an embodiment of the present invention. The steps in FIG. 8 can be concluded from the aforementioned embodiments and is summarized as follows.

Step 800: The flow begins.

Step 802: Use a timer to generate the time information.

Step 804: Perform a dummy read operation upon at least one portion of blocks in said multiple blocks according to the time information generated by the timer, wherein the dummy read operation is not triggered by a reading command of a host device.

To summarize, in the flash memory controller of the present invention, via automatically detecting the reading state of blocks and automatically performing the dummy read operation upon the unread blocks, the deterioration of data in blocks due to not being read for long can be effectively prevented, thereby enhancing the storage quality and the reading efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory controller, wherein the flash memory controller is arranged to access a flash memory module, the flash memory module comprises multiple flash memory chips, each of the flash memory chips comprises multiple blocks, each of the blocks comprises multiple pages, and the flash memory controller comprises:
a read only memory (ROM), arranged to store a program code;
a microprocessor, arranged to execute the program code to control the access of the flash memory module; and
a timer, arranged to generate time information;
wherein the microprocessor refers to the time information generated by the timer to perform a dummy read operation upon at least one portion of blocks of said multiple blocks, wherein the dummy read operation is not triggered by a read command from a host device;
wherein the flash memory controller comprises read-enable pin connected to the flash memory module; and during the microprocessor performing the dummy read operation upon said at least one portion of blocks, the read-enable pin is disabled to make the flash memory controller not to receive the data the flash memory module reads from said at least one portion of blocks.

2. The flash memory controller of claim 1, wherein during the microprocessor performs the dummy read operation upon said at least one portion of blocks, the microprocessor only reads a page of each block of said at least one portion of blocks.

3. The flash memory controller of claim 1, wherein the microprocessor uses single-level cell (SLC) reading mode to perform the dummy read operation upon said at least one portion of blocks.

4. The flash memory controller of claim 3, wherein said at least one portion of blocks comprises at least one of multi-level cell (MLC) blocks, triple-level cell (TLC) blocks and quad-level cell (QLC) blocks.

5. The flash memory controller of claim 3, wherein the microprocessor only uses a single reading voltage to read said at least one portion of blocks in order to perform the dummy read operation.

6. The flash memory controller of claim 1, wherein the flash memory controller comprises a buffer memory, the buffer memory stores a block-recording table to record the information about which blocks among said multiple blocks store data; and the microprocessor refers to the block-recording table to select blocks that store data, as said at least one portion of blocks.

7. The flash memory controller of claim 6, wherein the microprocessor refers to the time information generated by the timer to periodically perform the dummy read operation upon said at least one portion of blocks.

8. The flash memory controller of claim 1, wherein the flash memory controller comprises a buffer memory, the buffer memory stores a block reading time recording table to record blocks among said multiple blocks that have been read and corresponding time information; and the microprocessor refers to the block reading time recording table in order to select said at least one portion of blocks from said multiple blocks.

9. The flash memory controller of claim 8, wherein the block reading time recording table records blocks among said multiple blocks that have been read, and records the last read time-point of each of the blocks that have been read.

10. The flash memory controller of claim 8, wherein the block reading time recording table records blocks among said multiple blocks that have been requested for reading by a host device, and records last read time-point of each of the blocks that have been read.

11. An electronic device comprises:
a flash memory module, comprising multiple flash memory chips, each of the flash memory chips comprises multiple blocks, and each of the blocks comprises multiple pages; and
a flash memory controller, arranged to access the flash memory module;
wherein the flash memory controller performs a dummy read operation upon at least one portion of blocks among said multiple blocks according to time information generated by a timer, wherein the dummy read operation is not triggered by a read command of a host device;
wherein the flash memory controller comprises a read-enable pin connected to the flash memory module, and during the flash memory controller performing the dummy read operation upon said at least one portion of blocks, the read-enable pin is disabled to make the flash memory controller not receive, from the flash memory module, the data the flash memory module reads from said at least one portion of blocks.

12. The electronic device of claim 11, wherein during the flash memory controller performing the dummy read operation upon said at least one portion of blocks, the flash memory controller only reads one page of each block of said at least one portion of blocks.

\* \* \* \* \*